(12) United States Patent
Kim (10) Patent No.: US 12,372,824 B1
(45) Date of Patent: Jul. 29, 2025

(54) PICTURE GENERATION APPARATUS

(71) Applicant: HYUNDAI MOBIS CO., LTD., Seoul (KR)

(72) Inventor: Byung Ki Kim, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 18/757,333

(22) Filed: Jun. 27, 2024

(51) Int. Cl.
*G02F 1/1333* (2006.01)
*G02B 27/01* (2006.01)
*G02F 1/13357* (2006.01)
*H05K 7/20* (2006.01)

(52) U.S. Cl.
CPC ....... *G02F 1/133385* (2013.01); *G02B 27/01* (2013.01); *H05K 7/20963* (2013.01)

(58) Field of Classification Search
None
See application file for complete search history.

(56) References Cited

U.S. PATENT DOCUMENTS

| | | | |
|---|---|---|---|
| 2018/0081174 A1* | 3/2018 | Yatsu | G02F 1/133553 |
| 2023/0221553 A1 | 7/2023 | Toyoahima | |
| 2023/0258971 A1* | 8/2023 | Kang | B60K 35/00 349/64 |
| 2023/0292476 A1 | 9/2023 | Kumano et al. | |

FOREIGN PATENT DOCUMENTS

| | | |
|---|---|---|
| DE | 10 2023 101 776 A1 | 9/2023 |
| WO | WO 2024/101184 A1 | 5/2024 |

OTHER PUBLICATIONS

German Office Action issued on Mar. 2, 2025 in corresponding German Patent Application No. 10 2024 119 260.7 (5 pages in English and 5 pages in German).

* cited by examiner

*Primary Examiner* — Phu Vu
(74) *Attorney, Agent, or Firm* — NSIP Law (57) ABSTRACT

A picture generation apparatus and a head-up display for a vehicle are provided. The picture generation apparatus includes: a Liquid Crystal Display (LCD) for projecting an image; a Back Light Unit for irradiating light onto the LCD; a first LCD heatsink including a first frame that contacts a first side of the LCD and surround a periphery of the LCD, and first heat dissipation fins extending from the first frame in a direction that does not cover the LCD; a second LCD heatsink including a second frame that contacts a second side of the LCD and surround a periphery of the first LCD heatsink, and second heat dissipation fins extending from the second frame in a direction that does not cover the LCD; and a Picture Generation Unit housing including a fixing portion to couple the LCD between the first LCD heatsink and the second LCD heatsink.

13 Claims, 11 Drawing Sheets

PICTURE GENERATION APPARATUS

BACKGROUND

1. Field

The present disclosure relates to a picture generation apparatus. More particularly, the present disclosure relates to a picture generation apparatus including a heatsink and a thermal dissipation pad for dissipating heat transferred from an LCD.

2. Description of the Related Art

The content described hereinbelow merely provides background information on the present disclosure and does not constitute the prior art.

Recently, an automobile market is developing toward an intelligent automobile equipped with Information Technology (IT). In particular, products that support driving stability and driver convenience are being released. Among them, head-up displays (HUD) for vehicles are receiving attention.

The HUD is a device that displays images containing vehicle speed, a remaining fuel level, and route information on a windshield that is a front window of the vehicle. The HUD device is generally configured to reflect HUD information projected from a Picture Graphic Unit (PGU) through an aspherical mirror and display the information on the windshield.

The HUD may include a case with an internal accommodation space, a Picture Generation Unit (PGU) that projects an image related to vehicle operation information, a reflection member, a dust cover, etc. Due to its nature, the HUD is installed under the windshield of the vehicle.

The PGU may include a light source that emits light, a Printed Circuit Board (PCB) on which the light source is disposed, a Liquid Crystal Display (LCD) that projects an image, a lens that uniformly condenses light transmitted from the light source to the LCD, and a diffuser that evenly diffuses light across the LCD.

In particular, the LCD that projects the image related to vehicle operation information absorbs heat from sunlight passing through the windshield and a radiant heat source of the light source. When the LCD is continuously exposed to high temperature, the LCD may deteriorate and a lifespan thereof may be shortened.

Conventionally, in order to solve this problem, an aspherical mirror rotary structure using a separate illumination sensor has been applied. However, as the aspherical mirror rotates while driving, there is a problem that it may be recognized as the malfunction of the device from the viewpoint of a Fail Safe Function or a driver. Therefore, there is a need to extend the lifespan of the LCD by preventing the deterioration of the LCD without affecting the image related to the vehicle operation information.

SUMMARY

In view of the above, the present disclosure provides a picture generation apparatus that dissipates heat transferred from an LCD using a plurality of heatsinks, thereby preventing the LCD from deteriorating.

According to embodiments of the present disclosure, a picture generation apparatus dissipates heat transferred from an LCD using a heatsink and a thermal dissipation pad, thereby preventing the LCD from deteriorating.

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In a general aspect of the disclosure, a picture generation apparatus includes a Liquid Crystal Display (LCD) for projecting an image; a Back Light Unit (BLU) for irradiating light onto the LCD; a first LCD heatsink including a first frame configured to contact at least a portion of a first side of the LCD and to surround a periphery of the LCD, and one or more first heat dissipation fins extending from the first frame in a direction that does not cover the LCD; a second LCD heatsink including a second frame configured to contact at least a portion of a second side of the LCD and to surround a periphery of the first LCD heatsink, and one or more second heat dissipation fins extending from the second frame in a direction that does not cover the LCD; and a Picture Generation Unit (PGU) housing including a fixing portion to couple the LCD between the first LCD heatsink and the second LCD heatsink, wherein the first LCD heatsink and the second LCD heatsink are configured to dissipate heat transferred from the LCD through the one or more first heat dissipation fins and the one or more second heat dissipation fins.

The first frame may include: a first inner surface contacting the first side of the LCD; a first outer surface contacting the fixing portion; a first outer wall extending perpendicularly from the first inner surface to surround the LCD; a first opening for opening at least a portion of the first outer wall; and a hook portion protruding from an outer surface of the first outer wall to be forcibly fitted with the first LCD heatsink.

The one or more first heat dissipation fins may extend from the first frame through the first opening.

The second frame may include: a second inner surface contacting the second side of the LCD; a second outer surface contacting an upper frame of the PGU housing; a second outer wall extending perpendicularly from the second inner surface to surround a circumference of the first LCD heatsink; a second opening for opening at least a portion of the second outer wall; and an accommodation portion formed in a hollow shape on the second outer wall to be forcibly fitted with the hook portion.

The one or more second heat dissipation fins may extend from the second frame through the second opening.

The fixing portion may be configured in a hook shape to press at least a portion of the first outer surface.

In another general aspect of the disclosure, a picture generation apparatus includes: a Liquid Crystal Display (LCD) for projecting an image; a Back Light Unit (BLU) for irradiating light onto the LCD; a thermal dissipation pad disposed in front of the LCD and contacting a first side of the LCD; an LCD heatsink including a frame disposed in front of the thermal dissipation pad and contacting at least a portion of a side of the thermal dissipation pad, and one or more heat dissipation fins extending from the frame in a direction that does not cover the LCD; and a Picture Generation Unit (PGU) housing including a fixing portion to couple the thermal dissipation pad between the LCD heatsink and the LCD, wherein the thermal dissipation pad is configured to dissipate heat transferred from the LCD, and wherein the LCD heatsink is configured to dissipate heat transferred from the thermal dissipation pad.

The frame may include: an inner surface contacting one side of the thermal dissipation pad; and an outer surface contacting the fixing portion.

The thermal dissipation pad may include a graphite material and may be configured to diffuse and dissipate heat transferred from the LCD.

In yet another general aspect of the disclosure, a head-up display (HUD) for a vehicle, includes: an aspherical mirror; a Liquid Crystal Display (LCD) for projecting HUD information through the aspherical mirror and display the HUD information on a windshield of the vehicle; a Back Light Unit (BLU) for irradiating light onto the LCD; and a first LCD heatsink including one or more first heat dissipation fins, the first LCD heat sink in contact with a first side of the LCD and configured to dissipate heat away from the LCD.

The HUD may further include a second LCD heatsink having one or more second heat dissipation fins, the second LCD heat sink in contact with a second side of the LCD and configured to dissipate heat away from the LCD.

The HUD may further include a thermal dissipation pad disposed in front of the LCD and in contact with one or the sides of the LCD and at least one of the first heat sink, the second heat sink, or a combination thereof.

The thermal dissipation pad may be configured to dissipate heat transferred from the LCD to at least one of the first LCD heatsink, the second LCD heatsink, or a combination thereof.

The thermal dissipation pad may include a graphite material and may be configured to diffuse and dissipate heat transferred from the LCD.

DETAILED DESCRIPTION

Hereinafter, some embodiments of the present disclosure will be described in detail with reference to the accompanying illustrative drawings. In the following description, like reference numerals preferably designate like elements, although the elements are shown in different drawings. Further, in the following description of some embodiments, a detailed description of related known components and functions when considered to obscure the subject of the present disclosure will be omitted for the purpose of clarity and for brevity.

Additionally, various ordinal numbers or alpha codes such as first, second, i), ii), a), b), etc., may be prefixed. These numbers and codes are solely used to differentiate one component from the other but not to imply or suggest the substances, order, or sequence of the components. Throughout this specification, when a part "includes" or "comprises" a component, the part is meant to further include other components, not to exclude thereof unless specifically stated to the contrary.

Figure 1:
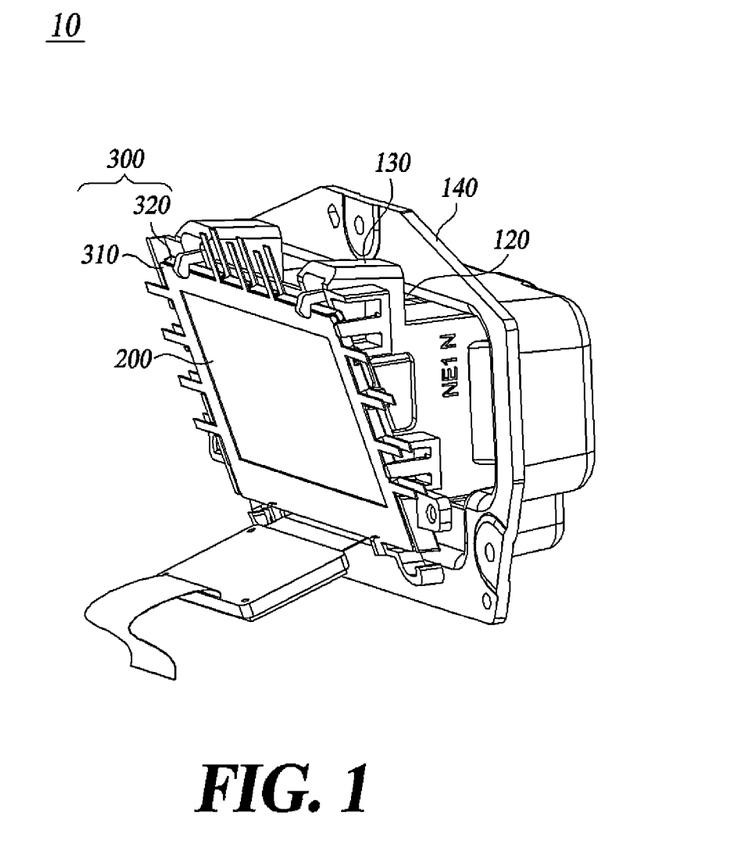
FIG. 1 is a perspective view illustrating a picture generation apparatus according to an embodiment of the present disclosure.

FIG. 1 is a perspective view illustrating a picture generation apparatus according to an embodiment of the present disclosure.

Figure 2:
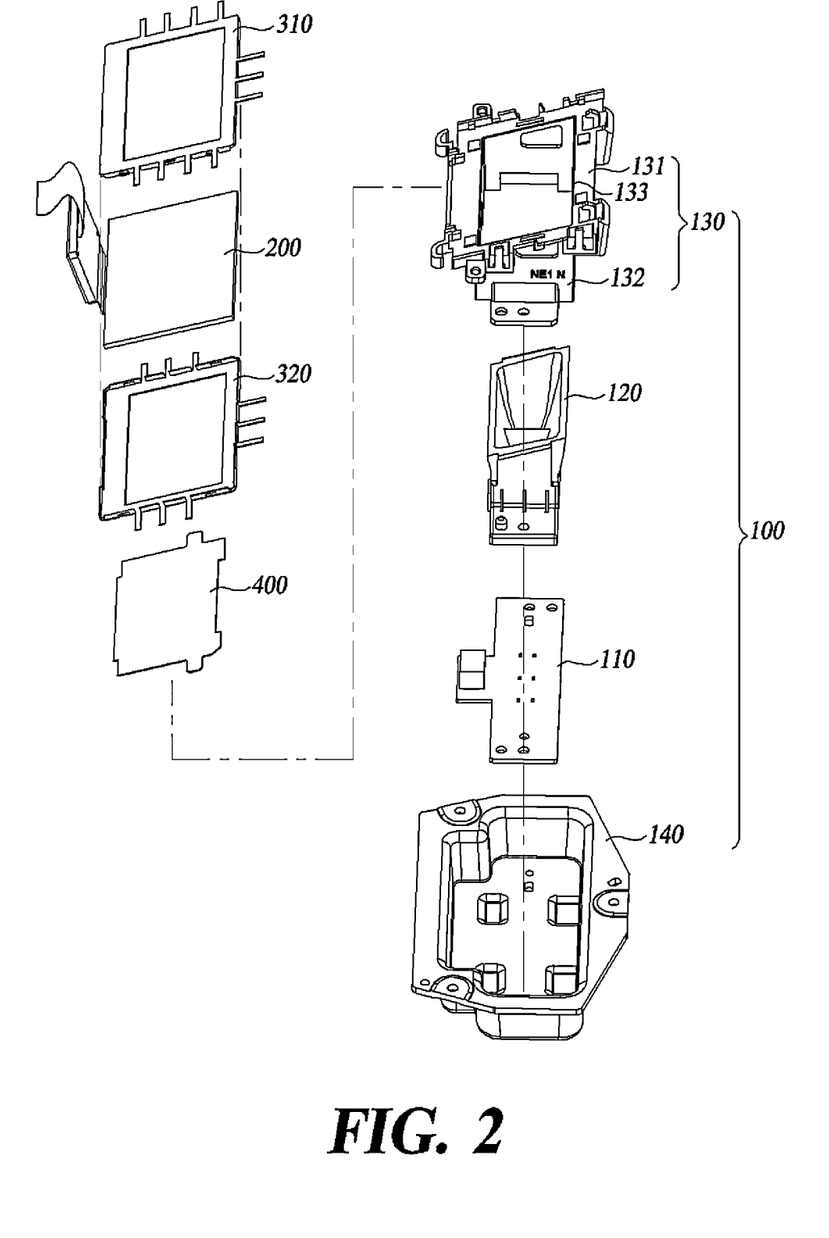
FIG. 2 is an exploded perspective view illustrating a picture imaging device according to an embodiment of the present disclosure.

FIG. 2 is an exploded perspective view illustrating a picture generation apparatus according to an embodiment of the present disclosure.

Figure 3:
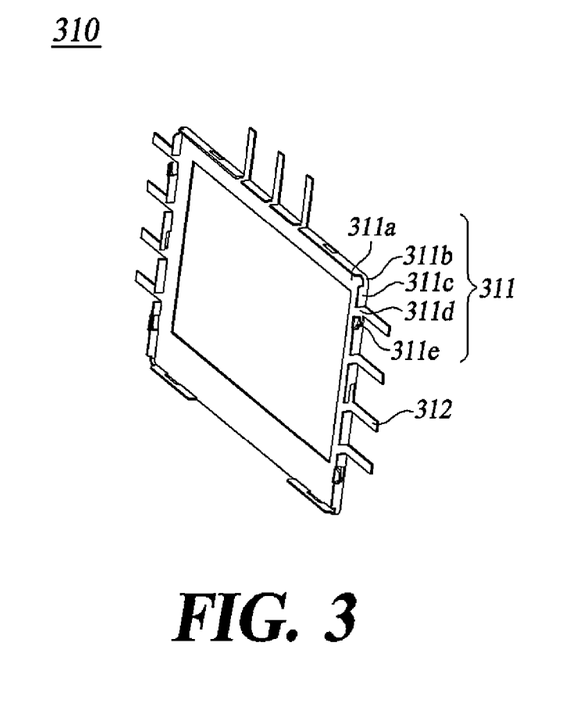
FIG. 3 is a perspective view illustrating a first LCD heatsink according to an embodiment of the present disclosure.

FIG. 3 is a perspective view illustrating a first LCD heatsink according to an embodiment of the present disclosure.

Figure 4:
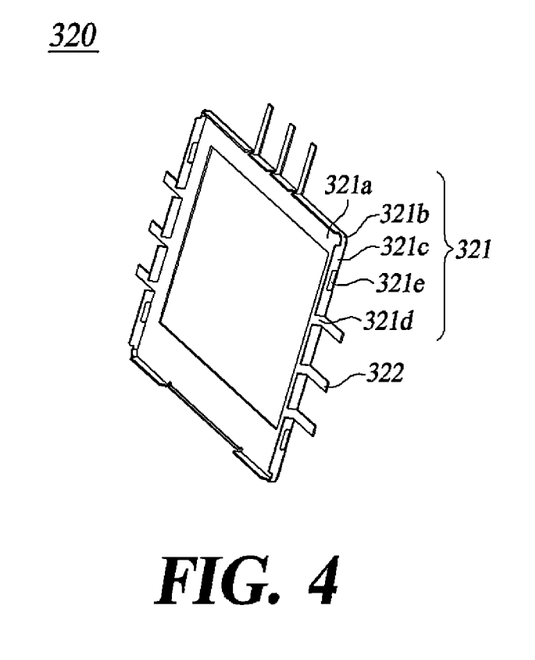
FIG. 4 is a perspective view illustrating a second LCD heatsink according to an embodiment of the present disclosure.

FIG. 4 is a perspective view illustrating a second LCD heatsink according to an embodiment of the present disclosure.

Figure 5:
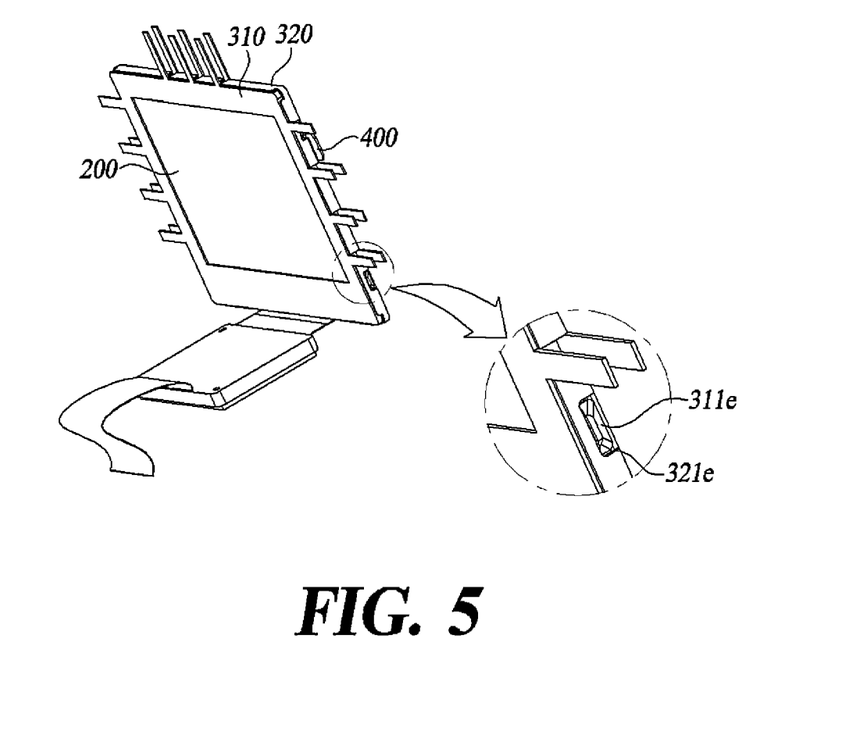
FIG. 5 is a diagram illustrating a structure in which an LCD is coupled between a first LCD heatsink and a second LCD heatsink according to an embodiment of the present disclosure.

FIG. 5 is a diagram illustrating a structure in which an LCD is coupled between a first LCD heatsink and a second LCD heatsink according to an embodiment of the present disclosure.

Figure 6:
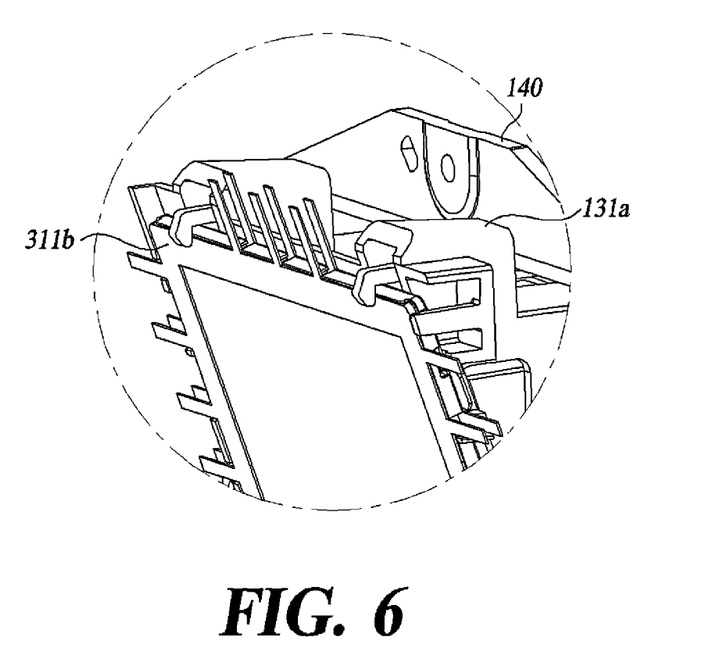
FIG. 6 is a diagram illustrating a diffuser according to an embodiment of the present disclosure.

FIG. 6 is a diagram illustrating a diffuser according to an embodiment of the present disclosure.

Figure 7:
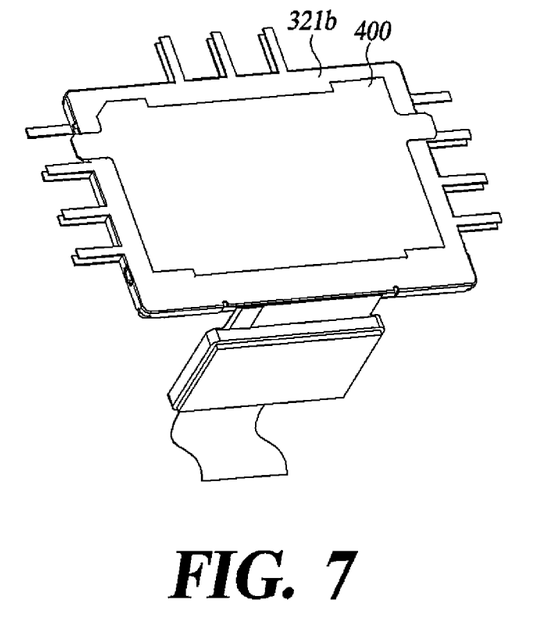
FIG. 7 is a diagram illustrating a fixing portion of a PGU housing according to an embodiment of the present disclosure.

FIG. 7 is a diagram illustrating a fixing portion of a PGU housing according to an embodiment of the present disclosure.

Referring to FIGS. 1 to 7, the picture generation apparatus (PGU) 10 includes all or part of a Back Light Unit (BLU) 100, a Liquid Crystal Display (LCD) 200, an LCD heatsink 300, and a diffuser 400.

The BLU 100 includes all or part of a Printed Circuit Board (PCB) 110, a funnel 120, a PGU housing 130, and a PCB heatsink 140.

The PCB 110 may include one or more light sources. Here, the light source may be a Light Emitting Diode (LED). The light source may be disposed on the PCB 110 in a predetermined pattern. Based on the path of light emitted from the light source, the PCB 110 may be disposed in back of the funnel 120 and configured to be coupled between the funnel 120 and the PCB heatsink 140. The light emitted from the light source passes through the funnel 120 and the diffuser 400 and then is incident on the rear of the LCD 200.

The funnel 120 may be disposed in back of the LCD 200 and the diffuser 400. The funnel 120 guides the path of light emitted from the light source so that the light is uniformly incident on the diffuser 400 and the LCD 200. The interior of the funnel 120 may be formed in the shape of a cup to guide the path of light emitted from the light source.

The PGU housing 130 includes all or part of an upper frame 131, a lower frame 132, and a protrusion portion 133. The upper frame 131 has a shape corresponding to the second LCD heatsink 320, and includes a fixing portion 131a for fixing the LCD 200 and the LCD heatsink 300. The fixing portion 131a may be configured in the shape of a hook to press at least a portion of an outer surface 311b of the first LCD heatsink 310. The lower frame 132 is configured to be coupled to the funnel 120. The protrusion portion 133 is configured to correspond to the shape of a display part 210 of the LCD 200. The protrusion portion 133 is configured so that light emitted from the light source is incident on the diffuser 400 and the display part 210 of the LCD 200.

The PCB heatsink 140 is configured to accommodate the PCB 110 and the funnel 120. The PCB heatsink 140 is configured to effectively dissipate heat generated from the PCB 110 and prevent a light leak from the light source.

The LCD 200 includes all or part of the display part 210 and an edge part 220. The display part 210 is formed on at least a portion of the LCD 200 to project an image using light incident from the light source on the rear of the LCD 200. The display part 211 may be configured to correspond to the shape of the protrusion portion 133, and may absorb heat due to a radiant heat source from the light source and incident sunlight. The edge part 220 is disposed to surround the display part 210, does not receive light from the light source, and does not project the image.

The LCD heatsink 300 includes all or part of a first LCD heatsink 310 and a second LCD heatsink 320. The first LCD heatsink 310 includes all or part of a first frame 311 and a first heat dissipation fin 312. The first frame 311 includes all or part of a first inner surface 311a, a first outer surface 311b, a first outer wall 311c, a first opening 311d, and a first hook portion 311e. The first inner surface 311a is formed to contact the edge part 220 on one side of the LCD 200. The first outer surface 311b is formed to contact the fixing portion 131a. The first outer wall 311c extends perpendicularly from the first inner surface 311a to surround the LCD 200. The first opening 311d is formed to open at least a portion of the first outer wall 311c to guide heat conducted from the LCD 200 to the first heat dissipation fin 312. The hook portion 311e protrudes from the outer surface of the first outer wall 311b and is configured to be forcibly fitted with an accommodation portion 321e. For instance, the hook portion 311e and the accommodation portion 321e may be fastened in a snap-fit structure. The first heat dissipation fin 312 extends from the first frame 311 through the first opening 311d and dissipates heat conducted from the LCD 200 to the outside.

The second LCD heatsink 320 includes all or part of a second frame 321 and a second heat dissipation fin 322. The second frame 321 includes all or part of a second inner surface 321a, a second outer surface 321b, a second outer wall 321c, a second opening 321d, and an accommodation portion 321e. The second inner surface 321a is formed to contact the edge part 220 on the other side of the LCD 200. The second outer surface 321b is formed to contact at least a portion of the upper frame 131. The second outer wall 321c extends perpendicularly from the second inner surface 321a to surround at least a portion of the first outer wall 311c. The second opening 321d is formed to open at least a portion of the second outer wall 321c to guide heat conducted from the LCD 200 to the second heat dissipation fin 322. The accommodation portion 321e is formed in a hollow shape on the second outer wall 321c to be forcibly fitted with the hook portion 311e. The second heat dissipation fin 322 extends from the second frame 321 through the second opening 321d and dissipates heat conducted from the LCD 200 to the outside.

The diffuser 400 is disposed in back of the LCD 200 and diffuses light emitted from the light source so that the light is evenly incident on the rear of the LCD 200. For instance, the diffuser 400 may be coupled between the second LCD heatsink 320 and the upper frame 131 of the PGU housing.

Figure 8:
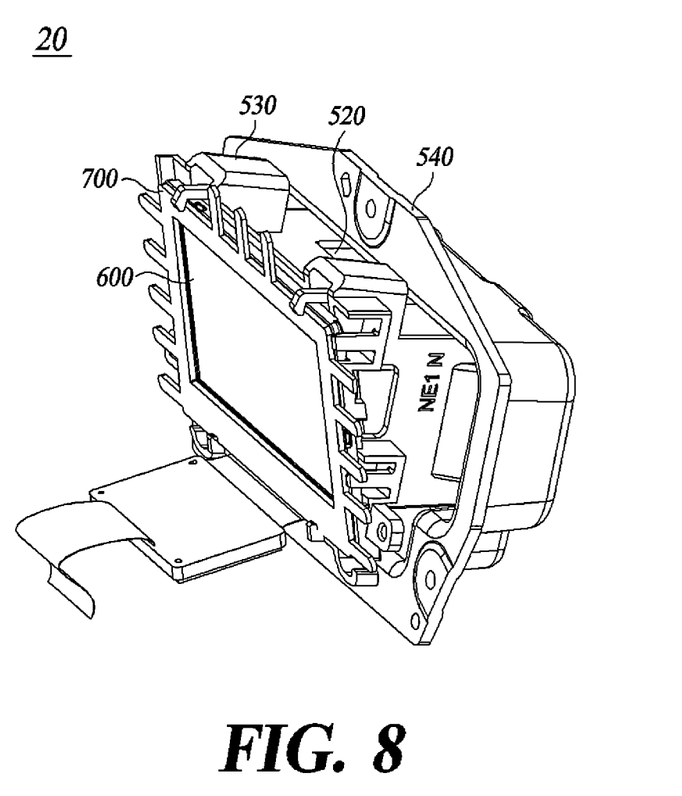
FIG. 8 is a perspective view illustrating a picture generation apparatus according to another embodiment of the present disclosure.

FIG. 8 is a perspective view illustrating a picture generation apparatus according to another embodiment of the present disclosure.

Figure 9:
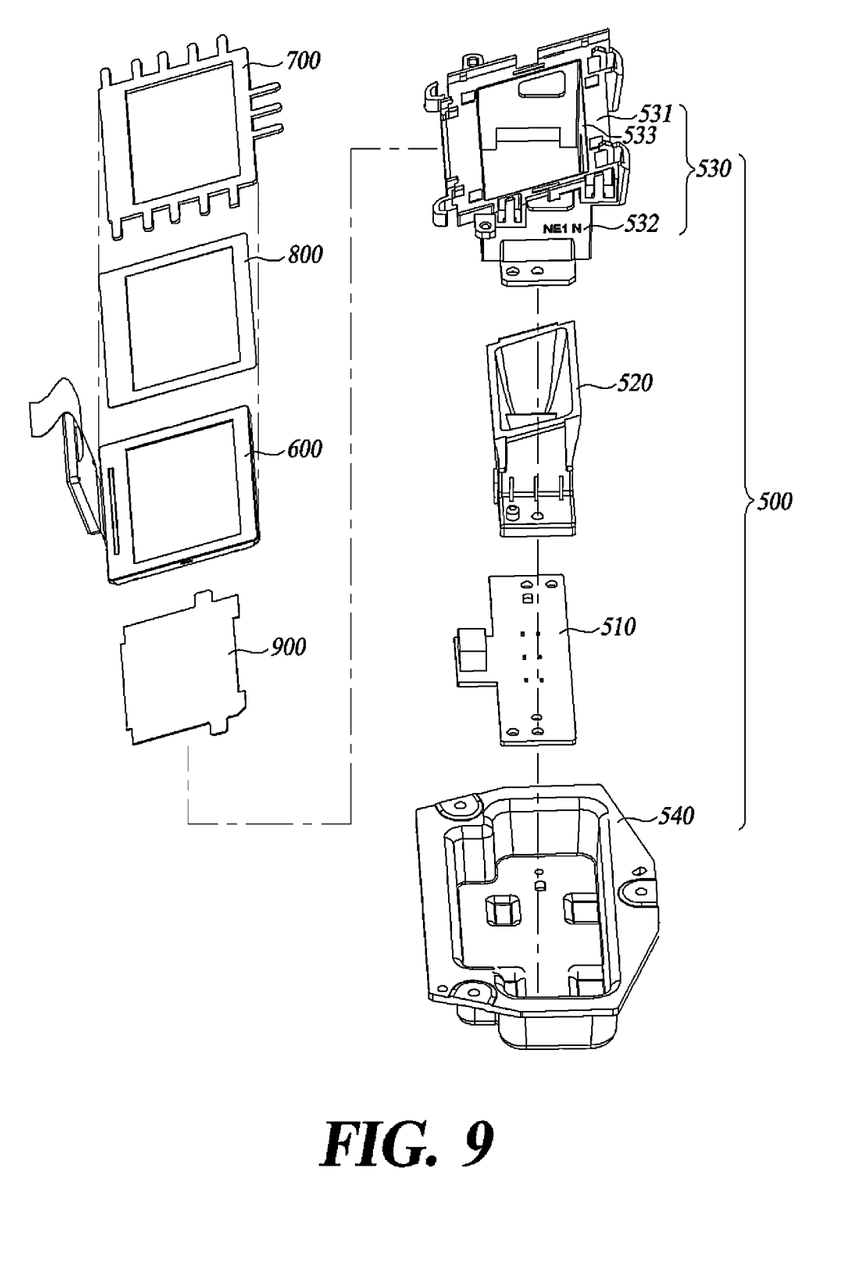
FIG. 9 is an exploded perspective view illustrating a picture imaging device according to another embodiment of the present disclosure.

FIG. 9 is an exploded perspective view illustrating a picture imaging device according to another embodiment of the present disclosure.

Figure 10:
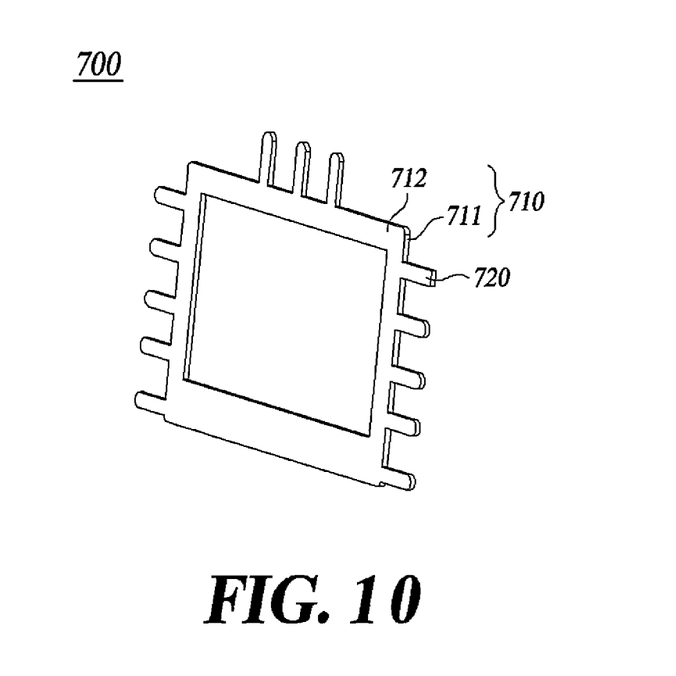
FIG. 10 is a perspective view illustrating an LCD heatsink according to another embodiment of the present disclosure.

FIG. 10 is a perspective view illustrating an LCD heatsink according to another embodiment of the present disclosure.

Figure 11:
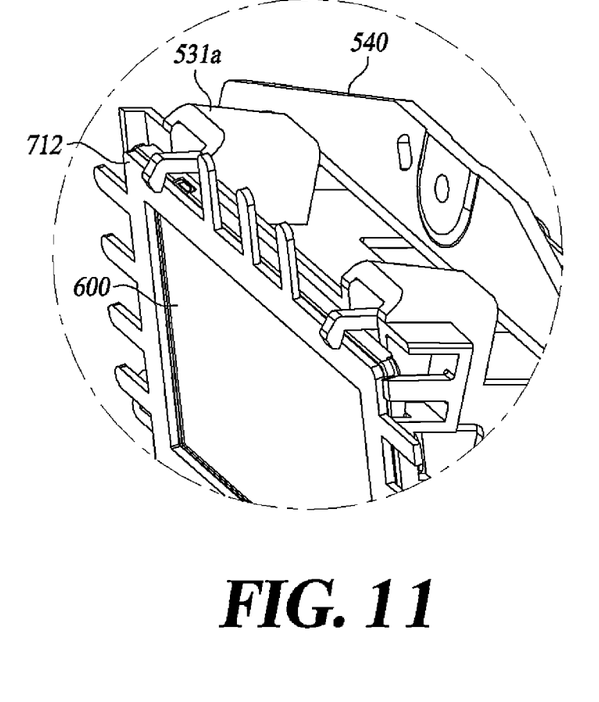
FIG. 11 is a diagram illustrating a fixing portion of a PGU housing according to an embodiment of the present disclosure.

FIG. 11 is a diagram illustrating a fixing portion of a PGU housing according to an embodiment of the present disclosure.

Referring to FIGS. 8 to 11, the picture generation apparatus 20 remains the same as that described in the embodiment shown in FIGS. 1 to 7 except for an LCD heatsink 700, a thermal dissipation pad 800, and a diffuser 900. Hereinafter, a duplicated description of the same components will be omitted, and differences between the embodiments will be mainly described.

The picture generation apparatus (PGU) 20 includes all or part of a Back Light Unit (BLU) 500, a Liquid Crystal Display (LCD) 600, an LCD heatsink 700, a thermal dissipation pad 800, and a diffuser 900.

The BLU 500 includes all or part of a Printed Circuit Board (PCB) 510, a funnel 520, a PGU housing 530, and a PCB heatsink 540.

The PGU housing 530 includes all or part of an upper frame 531, a lower frame 532, and a protrusion portion 533. The upper frame 531 has a shape corresponding to the LCD 600, and includes a fixing portion 531a for fixing the LCD 600, the LCD heatsink 700, and the thermal dissipation pad 800. The fixing portion 531a may be configured in the shape of a hook to press at least a portion of an outer surface 712 of the LCD heatsink 700.

The LCD heatsink 700 is disposed in front of the thermal dissipation pad 800, and includes all or part of a frame 710 and a heat dissipation fin 720. The frame 710 includes all or part of an inner surface 711 and an outer surface 712. The inner surface 711 is formed to contact at least a portion of one side of the thermal dissipation pad 800. The outer surface 712 is formed to contact the fixing portion 531a. The heat dissipation fin 720 extends from the frame 710 in a direction that does not cover the LCD 600, and dissipates heat transferred from the LCD 600 to the outside.

The thermal dissipation pad 800 is disposed in front of the LCD 600 and formed to contact at least a portion of one side of the LCD 600. For instance, the thermal dissipation pad 800 may be formed of a graphite material to diffuse and dissipate heat transferred from the LCD.

In another embodiment of the disclosure, the picture generation apparatus may include a head-up display (HUD) for a vehicle. The HUD may include an aspherical mirror, a Liquid Crystal Display (LCD) for projecting HUD information through the aspherical mirror and display the HUD information on a windshield of the vehicle, a Back Light Unit (BLU) for irradiating light onto the LCD, and a first LCD heatsink including one or more first heat dissipation fins, the first LCD heat sink in contact with a first side of the LCD and configured to dissipate heat away from the LCD. The HUD may further include a second LCD heatsink including one or more second heat dissipation fins, with the second LCD heat sink in contact with a second side of the LCD and configured to dissipate heat away from the LCD. The HUD may further include a thermal dissipation pad disposed in front of the LCD, and in contact with one or the sides of the LCD and at least one of the first heat sink, the second heat sink, or a combination thereof. The thermal dissipation pad is configured to dissipate heat transferred from the LCD to at least one of the first LCD heatsink, the second LCD heatsink, or a combination thereof. The thermal dissipation pad includes a graphite material and is configured to diffuse and dissipate heat transferred from the LCD. The HUD can interchangeably utilize the elements of the picture generation apparatus 10 and 20.

Although exemplary embodiments of the present disclosure have been described for illustrative purposes, those skilled in the art will appreciate that various modifications, additions, and substitutions are possible, without departing from the defining features by the embodiments. Therefore, exemplary embodiments of the present disclosure have been described for the sake of brevity and clarity. The scope of the technical idea of the embodiments of the present disclosure is not limited by the illustrations. Accordingly, one of ordinary skill would understand the scope of the claimed invention is not to be limited by the above explicitly described embodiments but by the claims and equivalents thereof.

What is claimed is:

1. A picture generation apparatus comprising:
    a Liquid Crystal Display (LCD) for projecting an image;
    a Back Light Unit (BLU) for irradiating light onto the LCD;
    a first LCD heatsink including
        a first frame configured to contact at least a portion of a first side of the LCD and to surround a periphery of the LCD, and
        one or more first heat dissipation fins extending from the first frame in a direction that does not cover the LCD;
    a second LCD heatsink including
        a second frame configured to contact at least a portion of a second side of the LCD and to surround a periphery of the first LCD heatsink, and
        one or more second heat dissipation fins extending from the second frame in a direction that does not cover the LCD; and
    a Picture Generation Unit (PGU) housing including a fixing portion to couple the LCD between the first LCD heatsink and the second LCD heatsink,
    wherein the first LCD heatsink and the second LCD heatsink are configured to dissipate heat transferred from the LCD through the one or more first heat dissipation fins and the one or more second heat dissipation fins.

2. The picture generation apparatus of claim 1, wherein the first frame comprises:
    a first inner surface contacting at least a portion of the first side of the LCD;
    a first outer surface contacting the fixing portion;
    a first outer wall extending perpendicularly from the first inner surface to surround the LCD;
    a first opening for opening at least a portion of the first outer wall; and
    a hook portion protruding from an outer surface of the first outer wall to be forcibly fitted with the first LCD heatsink.

3. The picture generation apparatus of claim 2, wherein the one or more first heat dissipation fins extend from the first frame through the first opening.

4. The picture generation apparatus of claim 3, wherein the second frame comprises:
    a second inner surface contacting at least a portion of the second side of the LCD;
    a second outer surface contacting at least a portion of an upper frame of the PGU housing;
    a second outer wall extending perpendicularly from the second inner surface to surround a circumference of the first LCD heatsink;
    a second opening for opening at least a portion of the second outer wall; and
    an accommodation portion formed in a hollow shape on the second outer wall to be forcibly fitted with the hook portion.

5. The picture generation apparatus of claim 4, wherein the one or more second heat dissipation fins extend from the second frame through the second opening.

6. The picture generation apparatus of claim 2, wherein the fixing portion is configured in a hook shape to press at least a portion of the first outer surface.

7. A picture generation apparatus comprising:
    a Liquid Crystal Display (LCD) for projecting an image;
    a Back Light Unit (BLU) for irradiating light onto the LCD;
    a thermal dissipation pad disposed in front of the LCD and contacting at least a portion of a first side of the LCD;
    an LCD heatsink including
        a frame disposed in front of the thermal dissipation pad and contacting at least a portion of a side of the thermal dissipation pad, and
        a plurality of heat dissipation fins extending from the frame in a direction that does not cover the LCD, wherein some of the plurality of heat dissipation fins are elongated in a direction parallel to a first direction perpendicular to an image projecting direction, and the other of the plurality of heat dissipation fins are elongated in a second direction perpendicular to both the first direction and the image projecting direction; and
    a Picture Generation Unit (PGU) housing including a fixing portion to couple the thermal dissipation pad between the LCD heatsink and the LCD,
    wherein the thermal dissipation pad is configured to dissipate heat transferred from the LCD, and
    wherein the LCD heatsink is configured to dissipate heat transferred from the thermal dissipation pad.

8. The picture generation apparatus of claim 7, wherein the frame comprises:
    an inner surface contacting one side of the thermal dissipation pad; and
    an outer surface contacting the fixing portion.

9. The picture generation apparatus of claim 7, wherein the thermal dissipation pad comprises a graphite material and is configured to diffuse and dissipate heat transferred from the LCD.

10. A head-up display (HUD) for a vehicle, the HUD comprising:
    an aspherical mirror;
    a Liquid Crystal Display (LCD) for projecting HUD information through the aspherical mirror and display the HUD information on a windshield of the vehicle;
    a Back Light Unit (BLU) for irradiating light onto the LCD;
    a first LCD heatsink including one or more first heat dissipation fins, the first LCD heat sink in contact with a first side of the LCD and configured to dissipate heat away from the LCD; and
    a second LCD heatsink including one or more second heat dissipation fins, the second LCD heat sink in contact with a second side of the LCD and configured to dissipate heat away from the LCD.

11. The HUD of claim 10, further comprising:

a thermal dissipation pad disposed in front of the LCD and in contact with one or the sides of the LCD and at least one of the first heat sink, the second heat sink, or a combination thereof.

12. The HUD of claim 11, wherein the thermal dissipation pad is configured to dissipate heat transferred from the LCD to at least one of the first LCD heatsink, the second LCD heatsink, or a combination thereof.

13. The HUD of claim 11, wherein the thermal dissipation pad comprises a graphite material and is configured to diffuse and dissipate heat transferred from the LCD.

\* \* \* \* \*